United States Patent
Beard

(10) Patent No.: US 8,093,765 B1
(45) Date of Patent: *Jan. 10, 2012

(54) SYSTEM FOR NOISE REDUCTION IN CIRCUITS

(75) Inventor: Paul Beard, Milpitas, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/790,742

(22) Filed: May 28, 2010

Related U.S. Application Data

(63) Continuation of application No. 10/860,856, filed on Jun. 3, 2004, now Pat. No. 7,728,461.

(60) Provisional application No. 60/475,847, filed on Jun. 3, 2003.

(51) Int. Cl.
*H03K 17/80* (2006.01)
*H02J 3/00* (2006.01)

(52) U.S. Cl. .............. 307/407; 307/1; 307/3; 329/318; 329/319; 329/320

(58) Field of Classification Search .............. 307/1, 3, 307/407; 329/318, 319, 320; 370/317
See application file for complete search history.

(56) References Cited

U.S. PATENT DOCUMENTS

| | | | |
|---|---|---|---|
| 4,609,834 A | 9/1986 | Gal | |
| 4,882,120 A | 11/1989 | Roe et al. | |
| 5,710,710 A | 1/1998 | Owen et al. | |
| 5,953,276 A | 9/1999 | Baker | |
| 6,043,829 A | 3/2000 | Inoue | |
| 6,288,566 B1 | 9/2001 | Hanrahan et al. | |
| 6,621,349 B2 | 9/2003 | Mullgrav, Jr. | |
| 6,794,895 B2 | 9/2004 | Falconer | |
| 6,910,165 B2 | 6/2005 | Chen et al. | |
| 7,728,461 B1 | 6/2010 | Beard | |

OTHER PUBLICATIONS

USPTO Notice of Allowance for U.S. Appl. No. 10/860,856 dated Jan. 28, 2010; 5 pages.
USPTO Final Rejection for U.S. Appl. No. 10/860,856 dated Sep. 23, 2009; 11 pages.
USPTO Non-Final Rejection for U.S. Appl. No. 10/860,856 dated Feb. 26, 2009; 11 pages.
USPTO Non-Final Rejection for U.S. Appl. No. 10/860,856 dated Sep. 25, 2008; 11 pages.
IEEE 100: The Authoritative Dictionary of IEEE Standards Terms, Seventh Edition, Standards Information Network, IEEE Press, 2000, p. 732; 3 pages.
Stan Gibilisco, "The Illustrated Dictionary of Electronics," The McGraw-Hill Companies, Inc., 2001, p. 477; 3 pages.

*Primary Examiner* — Rexford Barnie
*Assistant Examiner* — Hal Kaplan

(57) ABSTRACT

Disclosed is an improved noise reducing apparatus using an anti-circuit, including a digital logic circuit and a digital anti-circuit corresponding to the digital logic circuit. The digital anti-circuit functions to cancel noise generated by the digital logic circuit. The anti-circuit includes logic to generate a similar number of switching edges as the logic circuit, where the anti-circuit edges are in the opposite direction as the logic circuit. The anti-circuit may have a circuit structure close to that of the noisy circuit, or can be formed of components different in structure but generating an output pattern similar to (and opposite from) the noisy circuit. In some embodiments, the differently structured components can include a state machine coupled to a memory or look-up-table.

17 Claims, 8 Drawing Sheets

SYSTEM FOR NOISE REDUCTION IN CIRCUITS

The present application is a continuation of U.S. patent application Ser. No. 10/860,856, filed Jun. 3, 2004, which claims priority to U.S. Provisional Patent Application No. 60/475,847, filed Jun. 3, 2003.

TECHNICAL FIELD

This disclosure relates generally to electronic circuitry and, in particular, to a system for reducing noise in electrical circuits caused by digital sub-circuit components.

BACKGROUND OF THE INVENTION

Electrical "noise" is a problem for analog and digital circuit designers. This is particularly true for mixed signal circuits that include both digital and analog sub-circuits. FIG. 1 illustrates an exemplary conventional system 10 having both digital and analog blocks operating simultaneously. This system 10 includes a digital logic block 12 (noise generating device), an analog block 14 (noise sensitive device), a power supply 16, and a ground 18. An output from the analog block 14 is an output from the system 10.

Noise or voltage spikes are illustrated in FIG. 1 as a wavy power line and may be caused by, for example, variations or ripple in power supply voltage lines, by ground bounce, and by false triggering of signal transitions. Digital circuits generate noise when they switch between high and low levels. As illustrated in FIG. 1, switching in the digital block 12 causes a noise ripple on the power supply line 16. These noise ripples are input to the analog block 14, which passes them through to the output of the system 10. In some instances, the analog block 14 may actually amplify the input noise. Noise decreases the overall signal to noise ratio (SNR) for the system 10, which reduces the quality of the output.

Although it is possible to minimize or eliminate noise that is generated periodically and in a predetermined manner, by using various techniques, noise generated by switching digital circuits typically does not follow any set pattern and is not known what noise will be generated before it is generated, and therefore cannot be predicted, nor cancelled.

Digital circuit blocks tend to be less susceptible to being affected by noise than analog circuit blocks because digital blocks typically have larger signal margins than do analog blocks. Analog blocks tend to be quite sensitive to noise, and power-supply ripple may be directly visible on analog outputs, causing lower SNR and relatively poor performance. Thus, it is important to reduce or eliminate noise in circuits where possible.

One known solution to minimize noise is to provide separate power supplies and ground circuits to digital and analog circuits. Having separate supplies and grounds tend to improve the noise problems, but generally do not eliminate them. Other solutions include using grounding and shielding techniques, to varying degrees of success. Another commonly used technique is to slow down the edges of transitioning signals, thereby reducing the rate of change of voltage (dV/dT), and reducing the noise generated by the transitions. These techniques may be helpful but often are insufficient, especially at high frequency.

Embodiments of the invention address these and other limitations in the prior art.

SUMMARY OF THE INVENTION

According to embodiments of the invention, additional circuit components, referred to as "anti-circuits," are included in some circuits, which reduce overall noise generated by circuit components.

DETAILED DESCRIPTION

Embodiments of the invention are directed toward including "anti-circuits" in devices having noisy electric circuits. Both the noisy circuits and anti-circuits can be connected to the same power supply line. As a noisy circuit generates a signal that produces noise on the power supply line, its corresponding anti-circuit generates an opposite signal of "anti-noise." The noise and anti-noise destructively interfere with one another, which allows the power supply line to be relatively unaffected by noise. The power supply line can then connect to more noise-sensitive analog circuitry than would otherwise be possible.

Figure 2:
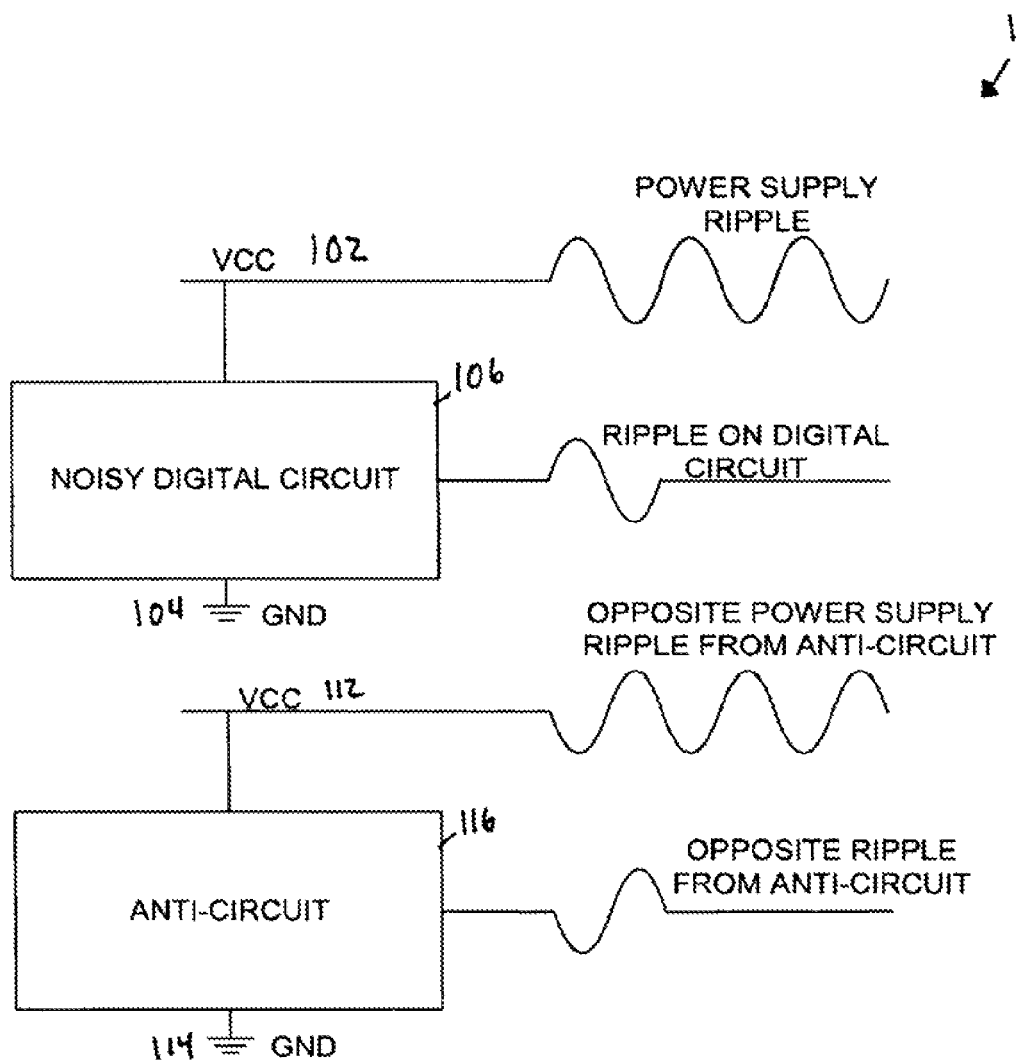
FIG. 2 is a block diagram that illustrates components of a system including an anti-circuit in a mixed-signal circuit according to embodiments of the invention.

An embodiment of noise reducing system elements using an anti-circuit is shown in FIG. 2. A system 100 includes two power supplies 102, 112, and two ground references 104, 114. The power supply 102 and the ground reference 104 supply operating voltages to a noisy digital circuit 106. Similarly, the power supply 112 and the ground reference 114 supply operating voltages to an anti-circuit 116.

Figure 1:
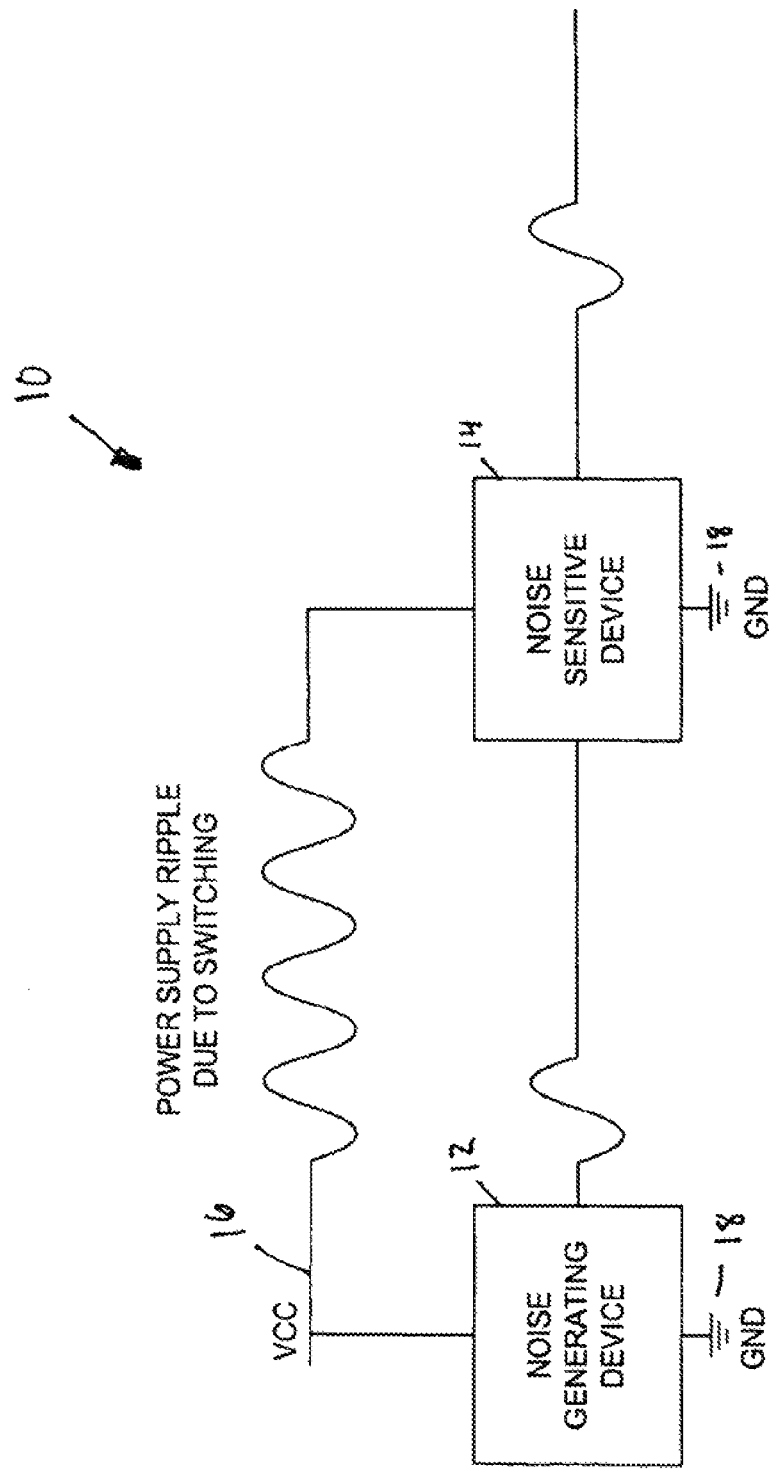
FIG. 1 is a block diagram illustrating noise generation in a conventional mixed-signal circuit.

The noisy digital circuit 106 produces noise on the power supply line 102, similar to that illustrated in FIG. 1. The anti-circuit 116 produces noise on the power supply line 112 that is opposite to that of the noisy circuit 106. It should be noted that the anti-circuit 116 does not make anti-noise that is reactive to noise generated by the noisy digital circuit 106. In other words, the anti-circuit 116 does not monitor a line for noise and then, after the noise is sensed, generate the anti-noise. Such a system would be problematic because the anti-noise would always be generated after the noise was already generated.

Figure 3:
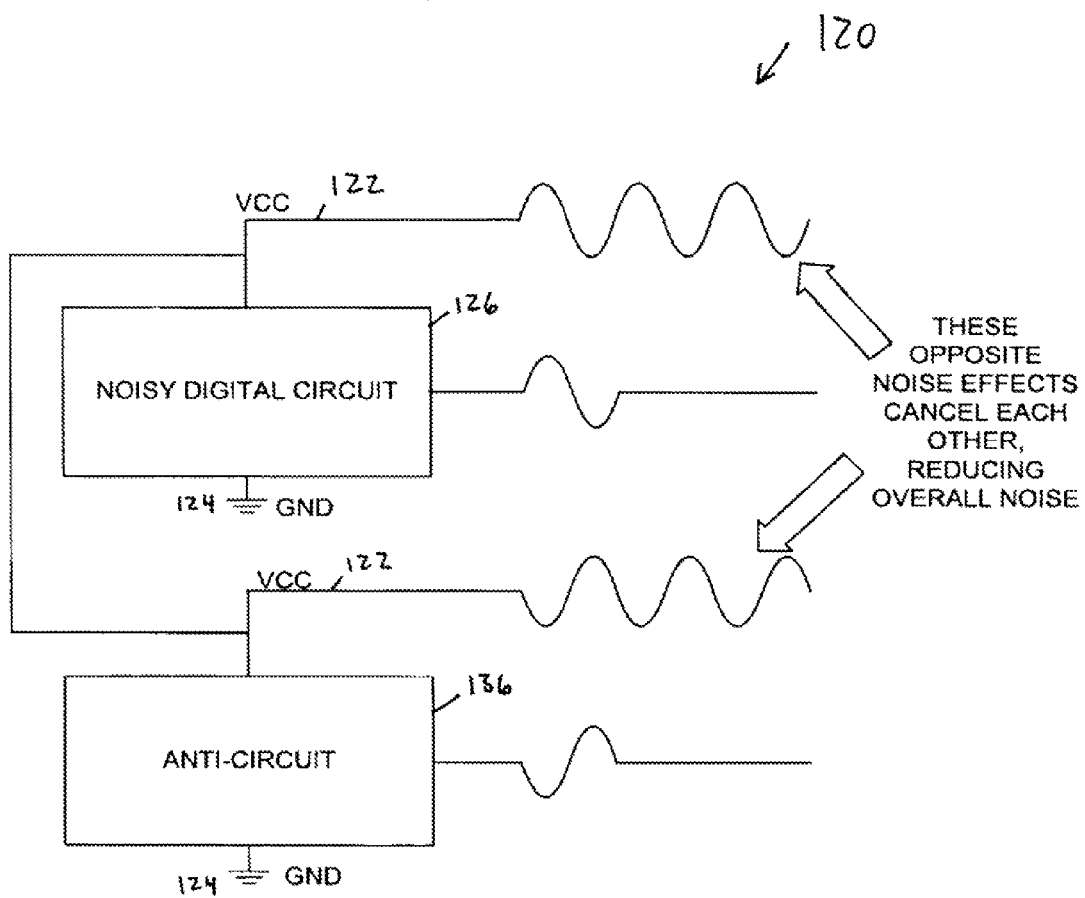
FIG. 3 is a block diagram that illustrates an effect of including an anti-circuit with a noisy digital circuit in a mixed-signal circuit to cancel noise generated by the noisy digital circuit according to embodiments of the invention.

FIG. 3 is similar to FIG. 2, and highlights operation of the components of FIG. 2. A system 120 of FIG. 3 includes only a single power supply line 122 and a single ground reference 124, which provide operating voltages to both a noisy digital circuit 126 and an anti-circuit 136. The noisy digital circuit 126 generates a noise ripple on the power supply line 122 while, simultaneously, the anti-circuit 136 generates an anti-noise ripple on the same power supply line 122.

These noise and anti-noise ripples destructively interfere with one another so that the end result is a power supply line 122 that has very little noise ripple. The noise generated on the power supply line 122 by the noisy digital circuit 126 is effectively cancelled by the anti-circuit 136.

The destructive interference of the noise on the output of the noisy circuit 126 with the anti-noise on the anti-circuit 136 occurs due to an effective superposition of the power supply 122. The principle of superposition applies when multiple waves travel through the same medium at the same time. Although the individual waves pass "through" each other without being disturbed, the net displacement of the common medium, at any point in space or time, is the sum of the individual wave displacements. In the embodiment illustrated in FIG. 3, the noise from the noisy circuit 126 is summed with the anti-noise from the anti-circuit 136. Because every positive ripple generated by the noisy circuit 126 is matched with a negative ripple generated by the anti-circuit 136, the sum of noise on the power supply line 122 is effectively zero.

With reference back to FIG. 2, the ripple shown on the power line 102 connected to the noisy digital circuit 106 is illustrated by a sine wave, while the ripple shown on the power line 112 connected to the anti-circuit 116 is illustrated as a negative sine wave. Of course, these illustrations are illustrative only to show the concepts of embodiments of the invention, and embodiments of the invention work in a similar manner regardless of the amplitude, duration, or shape of the noise generated by the noisy digital circuit 106.

Figure 4:
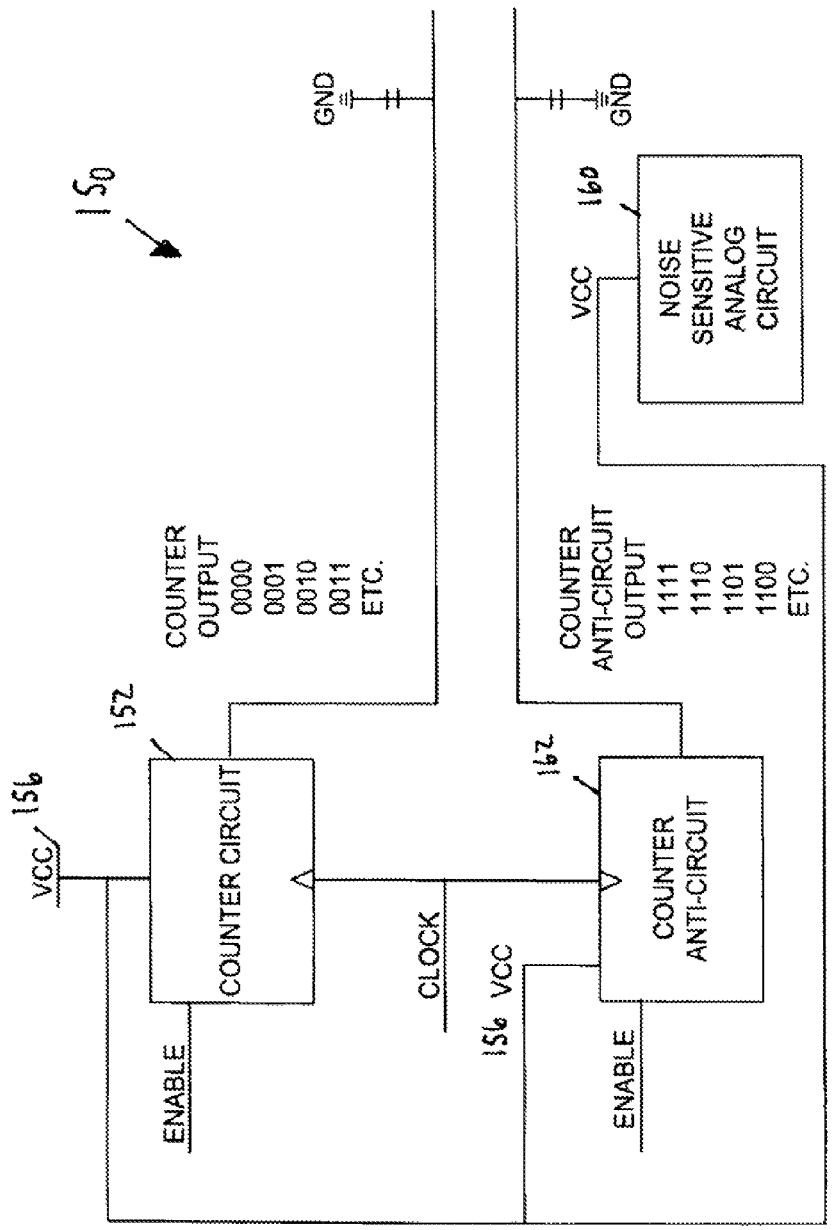
FIG. 4 is a block diagram of a digital counter circuit and a corresponding anti-circuit in a mixed-signal circuit according to embodiments of the invention.

FIG. 4 illustrates an exemplary embodiment of an improved noise reducing counter system 150 that includes a main counter circuit 152 and an anti-circuit 162 corresponding to the counter circuit. A single power supply line 156 provides power to the counter circuit 152 and the anti-circuit 162. Additionally, the power supply line 156 supplies power to a sensitive analog circuit 160. The anti-circuit 162 functions to switch the same number of edges as the main circuit 152, but in the opposite direction as the main circuit 152. In the exemplary embodiment, when the counter 152 changes from '0000' to '0001' (a single positive edge change), the anti-circuit 162 switches from '1111' to '1110', (a single negative edge change). Any noise generated on the power supply line 156 by the counter 152 is effectively cancelled from the anti-noise generated by the anti-circuit 162, resulting in a power supply line 156 that is relatively free from noise, or has an amount of noise greatly diminished than if the anti circuit 162 were not present. The "clean" power supply line 156 can then be used to power a sensitive analog circuit 160.

To produce an anti-noise pattern from the anti-circuit 162 that closely follows the noise pattern from the counter 152, several factors can be considered. For instance, the counter 152 and anti-circuit 162 can be situated in approximately the same physical location in a system or on a chip. This allows the power supply line 156 to have approximately the same trace dimensions in supplying both the counter 152 and anti-circuit 162. Further, loads from the counter 152 and anti-circuit 162, such as capacitive and resistive loads, can be formed so as to be similar to one another. One method of ensuring similar loads is to have an output line of both the counter 152 and anti-circuit 162 be relatively similar in length and be formed in relatively the same location as one another, as illustrated in FIG. 4. Additionally, the same number of ground and other connections can be formed on each output line.

Counters 152 are well known in the art and can be implemented by, for instance, a Johnson counter, part number HEF4017B, available from Phillips Semiconductors. Although the example of FIG. 4 uses an example of a counter for a noisy digital circuit, embodiments of the invention are not limited to counters, of course, and can be any sub-circuit that generates noise within a larger circuit.

Design of an anti-circuit will generally closely follow the design of the noisy circuit so that the noise and anti-noise are simultaneously generated in various conditions, such as supply voltage, operating temperature, etc. Specific circuit components of the anti-circuit 162 are well within the scope of one skilled in the art after determining a noise source. In some embodiments the anti-circuit 162 may be designed to closely follow the schematic layout of the noisy circuit 152. For instance, with reference to FIG. 4, inverters could be placed on output lines of a counter 152 to produce the anti-circuit 162. Or, negated outputs of internal flip flops or other circuit components could be used in designing the anti-circuits 162.

Figure 5:
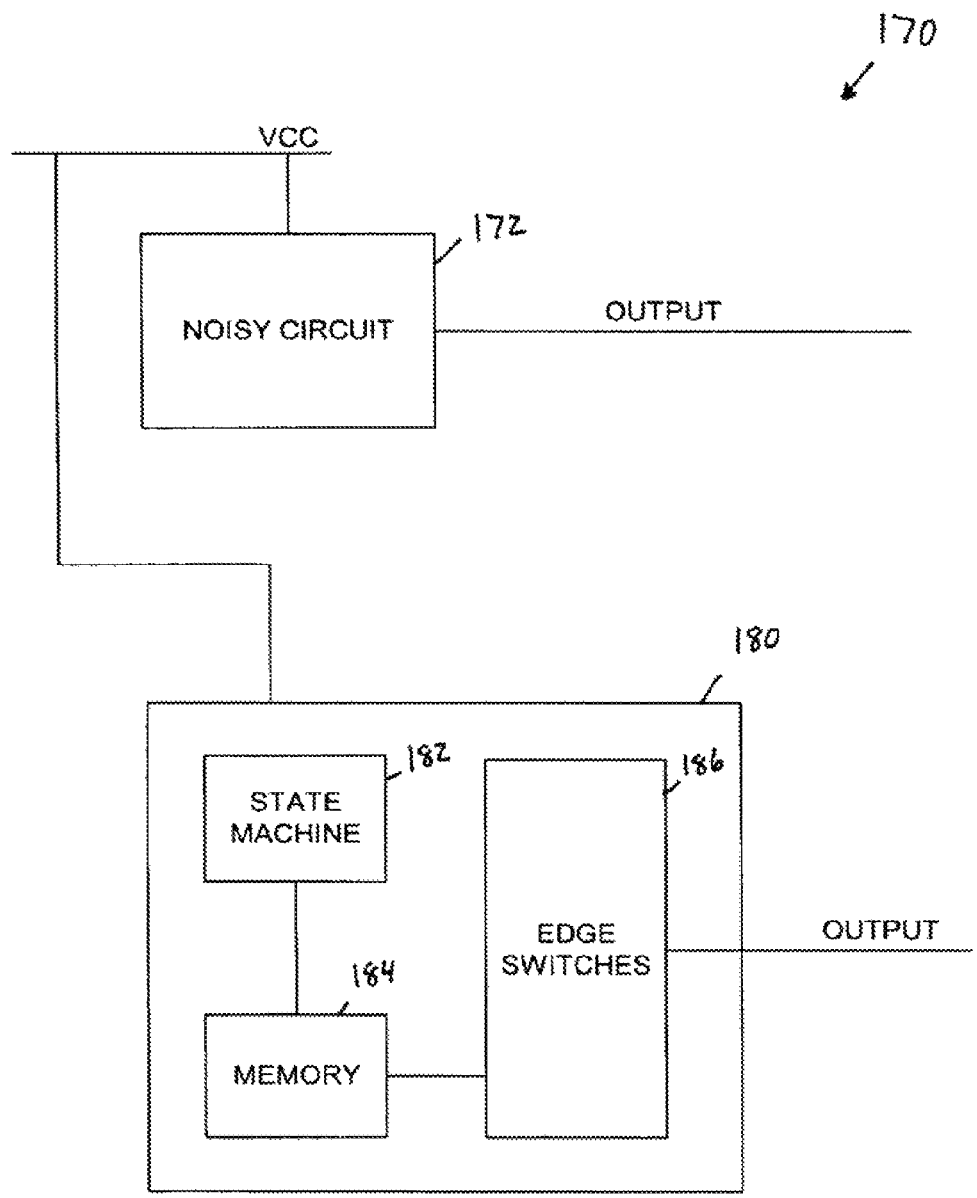
FIG. 5 is a block diagram of a noisy digital circuit and a simulated anti-circuit according to embodiments of the invention.

In other embodiments, the anti-circuit may 162 differ considerably in construction compared to the circuit components of the noisy circuit 152, yet still produce anti-noise that closely tracks the noise patterns of the noisy circuit 152. FIG. 5 illustrates an embodiment of the invention that accords to this example.

Illustrated in FIG. 5 is a system 170 that includes a noisy circuit 172 and an anti-circuit 180 "simulated" to produce anti-noise that tracks the noise generated by the noisy circuit 172. In other words, the anti-circuit 180 has a circuit architecture that is markedly different from that of the noisy circuit 172. This differs from the example of FIG. 4 where the anti-circuit 162 was built with nearly identical architecture of the noisy counter 152.

In such an alternate embodiment as illustrated in FIG. 5, the anti-circuit 180 can include a state machine 182, the output of which is connected to a memory 184 or look up table (LUT). Output from the memory 184 is connected to a set of edge switches 186 and drives the edge switches to trigger in an order opposite to that of the noisy circuit 172. The particular values stored in the memory 184 corresponding to the state of the state machine 182 and the number of edges to switch could, in one exemplary embodiment, be determined through simulation. In a situation where the reduction of noise is a priority, a code using minimal transitions, such as Gray code, could be used.

This alternate embodiment, described with reference to FIG. 5, may require fewer resources to implement than the embodiments described in FIG. 3 or 4. For instance, the embodiment illustrated in FIG. 4 typically requires double the amount of total area as that used by the noisy counter circuit 152. In other words, because the architecture of anti-circuit 162 closely follows that of the counter circuit 152, the overall circuit area consumed to have the noisy circuit 152 and anti-circuit 162 is approximately double the circuit area required by the noisy circuit 152 itself. The embodiment illustrated in FIG. 5, conversely, may use far less area because the architecture of the anti-circuit 180 may be markedly different (and smaller) than the noisy circuit 172. Specific designs of anti-circuits will be determined by the system designer once the designs for the noisy circuits are known.

Figure 6:
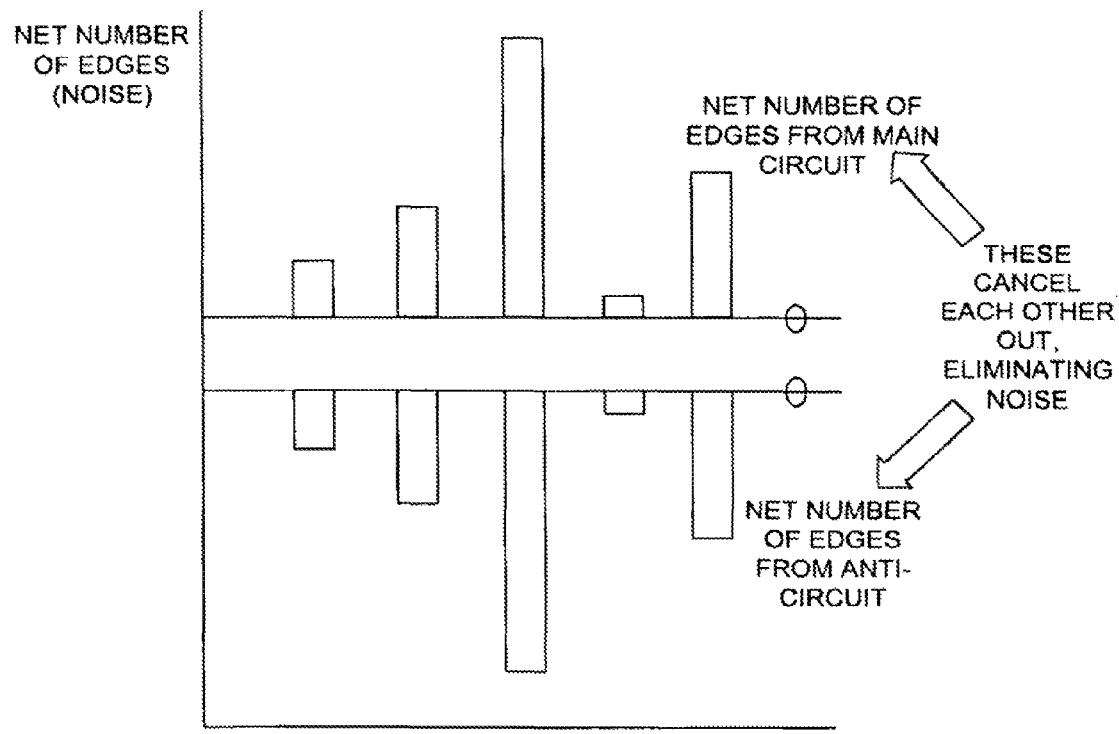
FIG. 6 is a histogram graph that illustrates noise cancellations due to an anti-circuit.

FIG. 6 shows an example of noise cancellation in a graphical form. In this example, the Y-axis shows a number of edge switches of a main circuit on the upper part of the graph, while the lower part of the graph illustrates a net number of edge switches from an anti-circuit. The total number of edges at any given time is of equal magnitude but in opposite in direction to one another. The combined effect of the circuit and anti-circuit is that any noise generated by switching the main circuit is cancelled by the same amount of switching (in an opposite direction) by the anti-circuit. The anti-circuit is positioned near its corresponding circuit and is designed to simultaneously output the opposite (inverted) digital result of its corresponding circuit. This matching of circuit outputs for the noisy circuit and anti-circuit may be performed for each output line of the noisy circuit. As mentioned above, the anti-circuit can have the same or a similar load as its corresponding circuit. This helps to reduce the noise spikes generated during zero to one and one to zero transitions.

Figure 7:
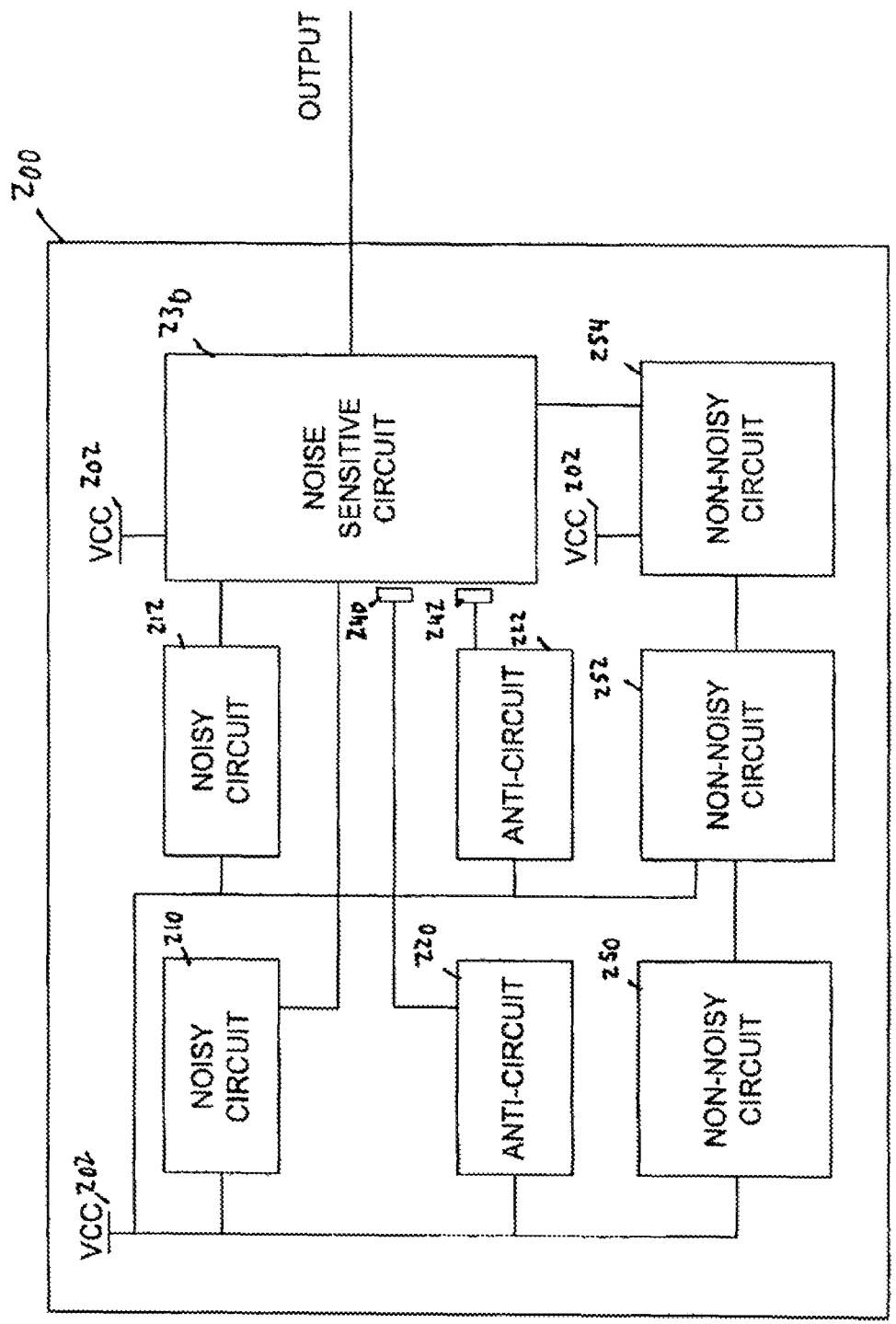
FIG. 7 is a block system diagram illustrating the use of multiple anti-circuits within a single mixed-signal circuit.

FIG. 7 is a block diagram that illustrates the use of multiple anti-circuits within a single mixed-signal circuit. A system 200 includes a pair of noisy circuits 210, 212 and corresponding anti-circuits 220, 222. Outputs from the noisy circuits 210, 212 are inputs to a noise sensitive circuit 230, such as an analog circuit. As described above, although analog circuits tend to be more sensitive to noise than do digital circuits, embodiments of the invention can apply in any situation where it is desired to reduce noise.

The anti-circuit 220 is structured to generate anti-noise that corresponds to noise generated by the noisy circuit 210. Similarly, the anti circuit 222 is structured to generate anti-noise that corresponds to noise generated by the noisy circuit 212. A signal output from the noisy circuit 210 is connected as an input to the noise sensitive circuit 230. An output from the anti-circuit 220 terminates in a load balancer 240, which can be located near the noise sensitive circuit 230. As described above, the output of an anti-circuit may closely follow the output of its corresponding noisy circuit. Further, the load balancer 240 ensures that the resistive and capacitive (and other) loading on the anti-circuit 220 is the same as or similar to the loading on the noisy circuit 210. Similarly, the anti-circuit 222 terminates in a load balancer 242.

The system 200 also includes a number of non-noisy circuits 250, 252, and 254. Outputs from the non-noisy circuits 250, 252, and 254 are serially coupled, with the output of the non-noisy circuit 254 being an input to the noise sensitive circuit 230. Because the circuits 250, 252, and 254 are not noisy, or the amount of noise they generate is negligible or otherwise acceptable, no corresponding anti-circuits are used to cancel the noise generated by the non-noisy circuits 250, 252, and 254.

A single power supply 202 can provide operating voltages to all of the components in the system 200.

As the system 200 operates, the noisy circuits 210 and 212 generate noise, due to switching or various factors. As this noise is generated, on the power supply line 202 or elsewhere, corresponding anti-noise is generated in the corresponding anti-circuits 220, 222. Noise from the noisy circuit 210 is effectively cancelled by the anti-noise produced by the anti-circuit 220. Similarly, noise from the noisy circuit 212 is effectively cancelled by the anti-noise produced by the anti-circuit 222. Any noise generated by the non-noisy circuits 250, 252, and 254 can safely be ignored.

As described above, the anti-circuits 220, 222 can be designed to closely match circuit components of the corresponding noisy circuits 210, 222, respectively. Or, the anti-circuits 220, 222 can be "simulated" anti-noise circuits, having a different circuit structure than their noise generating counterparts, as described with reference to FIG. 5 above. In yet other embodiments, one of the anti-circuits, for example 220, could be structured similar to its noisy counterpart, the noisy circuit 210, while the anti-circuit 222 could be simulated.

Figure 8:
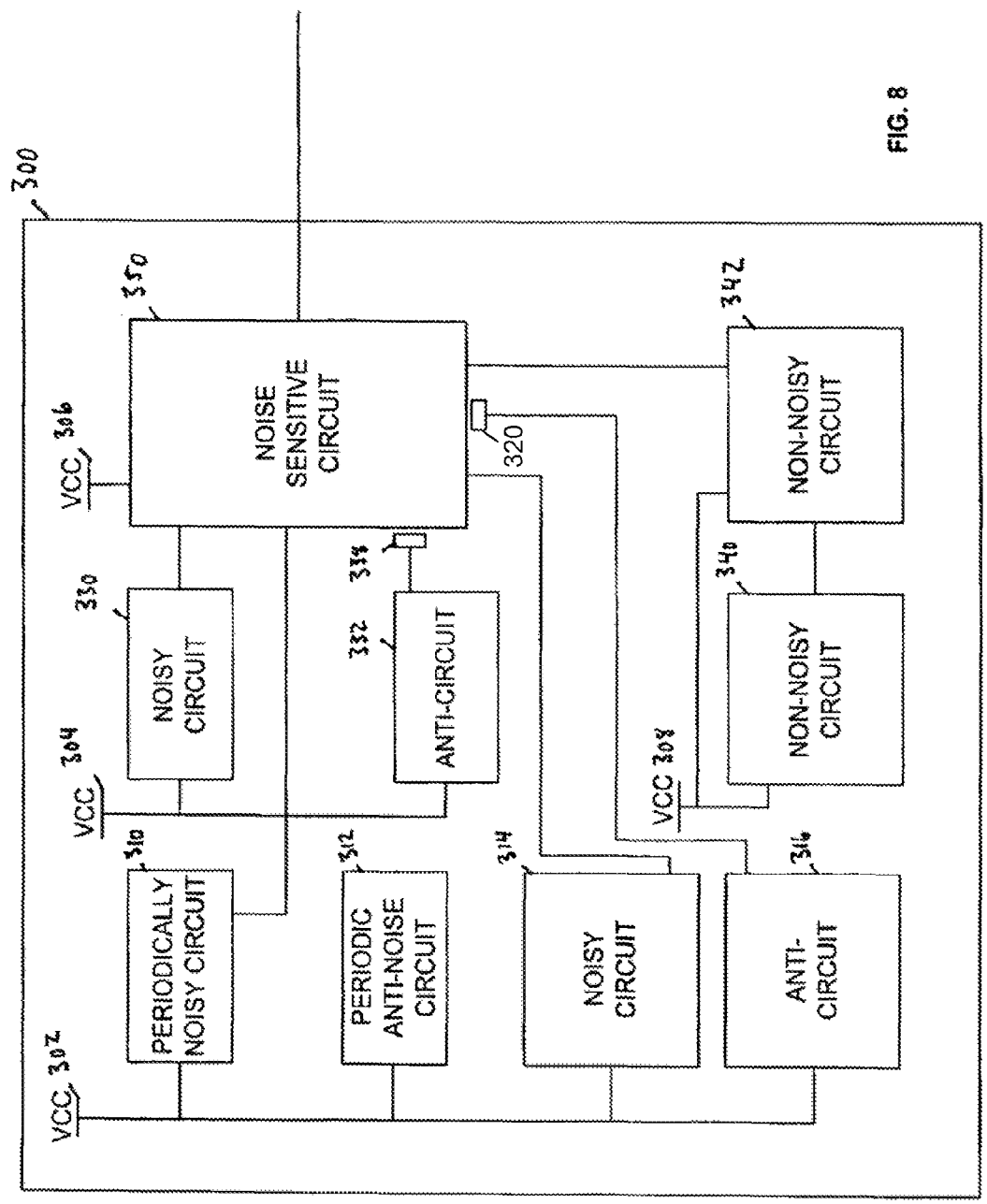
FIG. 8 is a block system diagram illustrating multiple anti-circuits and at least one periodic noise cancellation circuits used in conjunction within a single mixed-signal circuit.

It is important to note that embodiments of the invention can operate in conjunction with conventional noise reducing strategies. FIG. 8 illustrates such an example. In that figure, a system 300 includes separate power supply lines 302, 304, 306, and 308 supplying an operating voltage to respective circuits. Similarly, separate ground reference voltages coupled to each of the groups of respective circuits could also be used.

The power supply line 302 is coupled to a periodically noisy circuit 310, a periodic noise canceling circuit 312, an irregular noise circuit 314, and an anti-circuit 316. A periodically noisy circuit is one that generates noise on a power supply line, or elsewhere, that is periodic in nature, and is thus predictable. Consequently, it is relatively easy to construct a periodic anti-noise circuit 312 that generates an anti-noise signal that follows the same period as that of the periodically noisy circuit 310, but generates anti-noise that is opposite to the noise from the circuit 310. Such techniques are known in the art. What is not known is to combine a periodic anti-noise circuit 312 with an anti-circuit 316 which, as described above, generates anti-noise to cancel noise generated by an irregular noise circuit 314. An irregular noise circuit 314 is one that generates noise in a non-predictable pattern, such as those described above with reference to FIGS. 2-5 and 6-7, and therefore cannot be easily cancelled without using techniques according to embodiments of the invention.

Similar to FIG. 7, the embodiment illustrated in FIG. 8 includes a load balancer 320 coupled to the output of the anti-circuit 316. The load balancer 320 ensures an output from the anti-circuit 316 has similar load characteristics to the output of the noisy circuit 314. Note that no load balancer may be needed to couple to an output of the periodic anti-noise circuit 312, because all factors known to generate anti-noise that cancel the periodic noise generated by the periodically noisy circuit 310 are known beforehand, and the anti-noise circuit 312 can be designed to appropriately account for loading of the noisy circuit 310.

Also included in the system 300 are a noisy circuit 330 and a corresponding anti-circuit 332. An output of the noisy circuit 330 is coupled to a noise sensitive circuit 350, such as an analog circuit, while an output of the anti-circuit 332 is coupled to a load balancer 338. Further, two non-noisy circuits 340, 342 are also included in the system 300. These components operate similar as described above with reference to FIG. 7.

By including known techniques, such as power voltage supply and periodic noise cancellation along with the inventive techniques of using anti-circuits to cancel noise from noisy circuits, it is feasible to produce systems having much less noise than previously possible.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A noise reducing apparatus, comprising:
    a circuit to generate at least partially non-periodic noise; and
    an anti-circuit to generate at least partially non-periodic anti-noise to counteract at least a portion of the at least partially non-periodic noise generated by the circuit without sensing the at least partially non-periodic noise, wherein a circuit structure of the anti-circuit is configured to generate the at least partially non-periodic anti-noise that is substantially opposite to the at least partially non-periodic noise.

2. The apparatus of claim 1, wherein the anti-circuit comprises logic to generate a number of switching edges, and wherein the edges generated by the anti-circuit are in a substantially opposite direction as edges of the circuit.

3. The apparatus of claim 1, wherein the anti-circuit comprises a memory.

4. The apparatus of claim 1, wherein the anti-circuit comprises:
    a state machine;
    a memory coupled to the state machine; and
    a set of edge switches coupled to the memory and operative based on output from the memory.

5. The apparatus of claim 4, wherein the memory is a look up table (LUT).

6. A system for reducing noise, comprising:
    a first and a second noise generating circuits;
    a first anti-circuit configured to generate a first anti-noise corresponding to a first at least partially non-periodic noise generated by the first noise generating circuit without sensing the first at least partially non-periodic noise generated by the first noise generating circuit; and
    a second anti-circuit configured to generate a second anti-noise corresponding to a second at least partially non-periodic noise generated by the second noise generating circuit without sensing the second at least partially non-periodic noise generated by the second noise generating circuit, wherein the first anti-noise generated by the first anti-circuit counteracts at least a portion of the first at least partially non-periodic noise generated by the first noise generating circuit, and wherein the second anti-noise generated by the second anti-circuit counteracts at least a portion of the second at least partially non-periodic noise generated by the second noise generating circuit.

7. The system of claim 6, further comprising one or more secondary noise generating circuits, the one or more secondary noise generating circuits configured to generate less noise than the first and second noise generating circuits.

8. The system of claim 6, wherein the first and second noise generating circuits are coupled to a noise sensitive circuit.

9. The system of claim 6, wherein an output from the first noise generating circuit is substantially the same shape and length as an output from the first anti-circuit.

10. The system of claim 6, wherein an output from the first noise generating circuit has similar loading characteristics as an output from the first anti-circuit, wherein the loading characteristics comprise capacitive and resistive loading.

11. The system of claim 6, further comprising:
    a first power supply line coupled to the first noise generating circuit and to the first anti-circuit; and
    a second power supply line coupled to the second noise generating circuit and to the second anti-circuit.

12. A method of reducing noise generated in a circuit, comprising:
    generating irregular noise on a supply line when switching signals within a first circuit; and
    substantially simultaneously generating irregular anti-noise with a second circuit coupled to the supply line, the irregular anti-noise being similar in magnitude but substantially opposite in direction than the generated irregular noise, the irregular anti-noise counteracting at least a portion of the irregular noise, and the irregular anti-noise being generated without sensing the irregular noise.

13. The method of claim 12 wherein generating irregular anti-noise comprises switching digital signals within the second circuit.

14. The method of claim 12, wherein generating irregular anti-noise comprises switching an output of an anti-counter circuit in a direction opposite to that of switching an output of a counter circuit.

15. The method of claim 12, wherein generating irregular anti-noise comprises generating irregular anti-noise with a second circuit that is physically structured to be substantially similar to the first circuit.

16. The method of claim 12, wherein generating irregular anti-noise comprises generating irregular anti-noise from a switching circuit driven by a memory device.

17. The method of claim 12, wherein generating irregular anti-noise comprises:
    accepting an input signal into a state machine and generating an output;
    indexing the generated output in a memory to determine a memory location; and
    driving a set of output switches corresponding to data located at the indexed memory location.

* * * * *